United States Patent
Hirabayashi

(10) Patent No.: US 7,266,735 B2
(45) Date of Patent: Sep. 4, 2007

(54) SEMICONDUCTOR DEVICE HAVING ECC CIRCUIT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 548 days.

(21) Appl. No.: 10/739,123

(22) Filed: Dec. 19, 2003

(65) Prior Publication Data

US 2005/0086572 A1    Apr. 21, 2005

(30) Foreign Application Priority Data

Sep. 1, 2003    (JP) ............................. 2003-308839

(51) Int. Cl.
*G06F 11/00*    (2006.01)
(52) U.S. Cl. ..................... 714/703; 714/718
(58) Field of Classification Search ................ 714/718, 714/733, 703
See application file for complete search history.

(56) References Cited

U.S. PATENT DOCUMENTS

| | | | | |
|---|---|---|---|---|
| 4,891,809 A | * | 1/1990 | Hazawa | ....................... 714/703 |
| 6,070,255 A | * | 5/2000 | Dell et al. | ...................... 714/48 |
| 2002/0162069 A1 | * | 10/2002 | Laurent | ....................... 714/763 |
| 2003/0065996 A1 | * | 4/2003 | Shimada et al. | ............. 714/718 |
| 2003/0204795 A1 | * | 10/2003 | Adams et al. | ............... 714/718 |

FOREIGN PATENT DOCUMENTS

| | | |
|---|---|---|
| JP | 62-226353 | 10/1987 |
| JP | 1-256100 | 10/1989 |
| JP | 4-101253 | 4/1992 |
| JP | 2003-36697 | 2/2003 |

\* cited by examiner

*Primary Examiner*—Guy Lamarre
*Assistant Examiner*—Mujtaba K. Chaudry
(74) *Attorney, Agent, or Firm*—Oblon, Spivak, McClelland, Maier & Neustadt, P.C.

(57) ABSTRACT

A semiconductor device in which at least one bit of data bits configuring data read out from a memory is supplied to a pseudo error generating circuit in a test mode to generate a pseudo error bit which is supplied to an ECC (error connection code) circuit together with remainder bits of the data bits to obtain an error-corrected data which is then supplied to a BIST (Built-In-Self-Test) circuit for testing the error-corrected data obtained from the ECC circuit.

18 Claims, 7 Drawing Sheets

SEMICONDUCTOR DEVICE HAVING ECC CIRCUIT

CROSS-REFERENCE TO RELATED APPLICATIONS

This application is based upon and claims the benefit of priority from the prior Japanese Patent Application No. 2003-308839, filed Sep. 1, 2003, the entire contents of which are incorporated herein by reference.

BACKGROUND OF THE INVENTION

1. Field of the Invention

This invention relates to a semiconductor device and more particularly to a semiconductor device having an ECC circuit which corrects an error in output data from a memory.

2. Description of the Related Art

The operation speed of semiconductor devices is enhanced more and more and the integration density of elements of the devices is also extremely enhanced with the development of the semiconductor device technology. As a result, an influence by not only the degradation-fault but also the delay-fault as the fault mode of the device increases and a serious problem occurs. Therefore, the actual speed test, that is, at-speed test in the initial stage of the device manufacturing process becomes important. Particularly, a memory in the chip acts as a critical path of the whole chip in many cases, and therefore, a self-test circuit called a BIST (Built-In-Self Test) circuit is mounted on the chip and the at-speed test for the memory is made in the wafer stage.

The capacity of storage nodes of cells configuring the memory is reduced with shrinkage of elements, and therefore, a soft error of the memory develops into a major problem. As a measure to prevent occurrence of the soft error, an ECC (Error Correcting Code) circuit is mounted on the memory in the chip in many cases. The memory having the ECC circuit mounted thereon stores code bits for testing in addition to normal data bits. The ECC circuit detects the presence or absence of an error in the data bits based on the value of the code bits, detects one of the bits in which the error occurs, corrects the error and outputs the corrected bits to the exterior. The number of error bits in the same word which can be corrected is determined according to a code used by the ECC circuit. Generally, a one-bit error correction code or a SEC-DED code which is capable of performing a single error correction and two or more error detection is often used.

The block configuration of a conventional memory device used when the memory having the ECC circuit mounted thereon is tested by use of a BIST circuit is shown in FIG. 10. In FIG. 10, a BIST circuit 91 checks data output via an ECC circuit 92 and determines whether or not an error is present in output data of a memory array 93. However, in the memory device having the ECC circuit 92 mounted thereon, a larger number of operation processes are performed in a case wherein an error has occurred than in a case wherein no error has occurred. Therefore, a critical path of the memory operation often occurs when an error correction is made.

However, since the frequency of occurrence of soft errors is extremely low, the critical path hardly appears at the time of at-speed test. Therefore, in this case, the critical path is not dealt with as an object of the at-speed test.

For example, in Jap. Pat. Appln. KOKAI Publication Disclosure No. 2003-36697, a test circuit for a semiconductor memory is disclosed. The test circuit has a pseudo error signal generating circuit between a memory circuit and a BIST circuit, converts output data from the memory circuit according to a set signal and generates a pseudo error signal necessary for checking the operation of the BIST circuit.

However, since no ECC circuit is provided in the test circuit of the semiconductor memory disclosed in this Jap. Pat. Appln. KOKAI Publication Disclosure No. 2003-36697, no measure to cope with a soft error of the memory is taken.

BRIEF SUMMARY OF THE INVENTION

A semiconductor device according to an aspect of the present invention comprises a memory which stores data, an ECC circuit which corrects a bit error of data read out from the memory and generates correction data, a BIST circuit which tests the correction data output from the ECC circuit, and a pseudo error generating circuit which generates a pseudo error for at least one bit configuring the data read out from the memory and supplies the pseudo error to the ECC circuit in a test mode.

DETAILED DESCRIPTION OF THE INVENTION

There will now be described embodiments of this invention in detail with reference to the accompanying drawings.

FIRST EMBODIMENT

Figure 1:
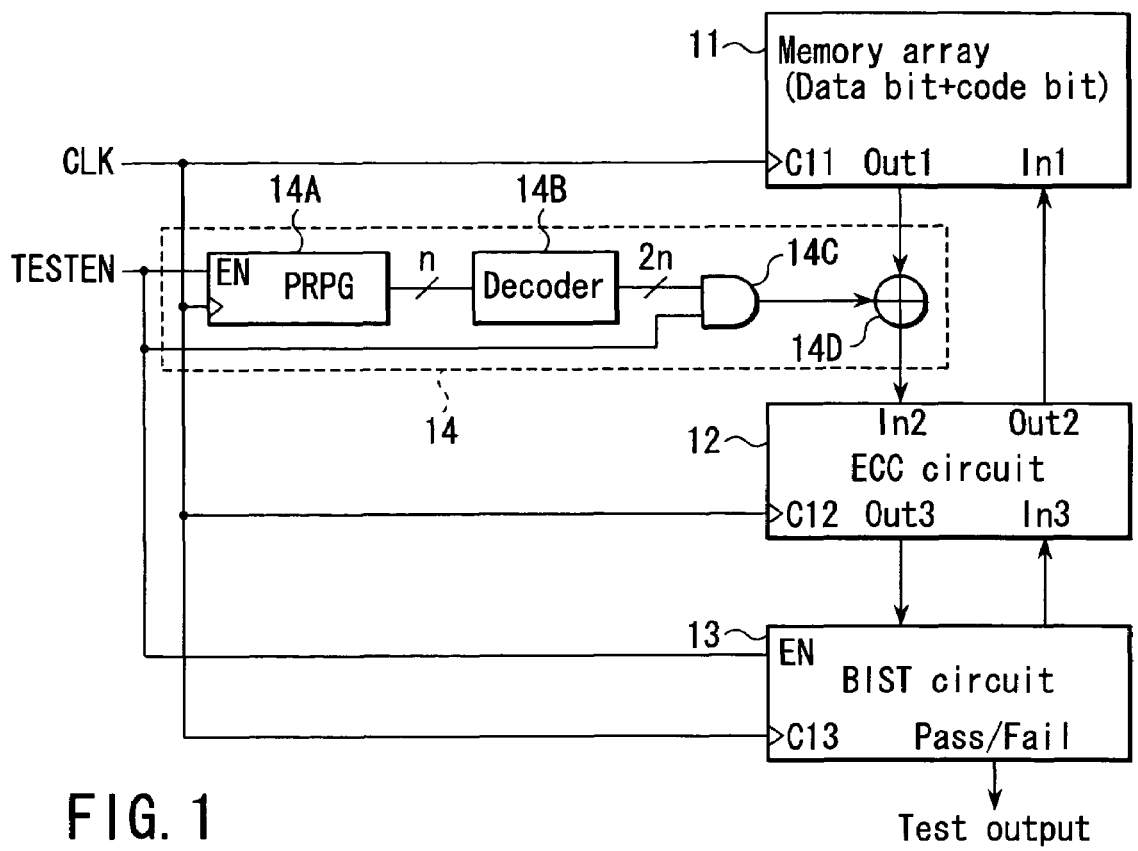
FIG. 1 is a block diagram showing the configuration of a first embodiment of this invention.

First, a first embodiment of this invention is explained with reference to FIG. 1. In FIG. 1, a memory array 11 is configured by an SRAM, for example. The memory array 11 stores the total number of bits including a preset number of data bits configuring data and a preset number of error bits of an error correction code as one word unit in each address position. Row and column address decoders which designate address positions of the memory array 11 are attached to the memory array 11, but they are omitted here to make the explanation simple. Further, an input port In1 and output port Out1 which are used to input/output data and a clock input port C11 which receives a clock CLK are provided in the memory array 11.

The data input port In1 of the memory array 11 is connected to a first output port Out2 of an ECC circuit 12 via a data path and the data output port Out1 is connected to a first input port In2 via another data path. The same clock CLK as that supplied to the memory array 11 is supplied to a clock input port C12. The ECC circuit 12 further includes a data input port In3 and data output port Out3 and is connected to a BIST circuit 13 via the above ports. The BIST circuit 13 includes a clock input port C13 and is supplied with the same clock CLK as that supplied to the memory 11 and ECC circuit 12. A test output indicating the test result of the BIST circuit 13 is output via a Pass/Fail terminal.

The BIST circuit 13 further includes an EN signal input terminal EN and is configured to be supplied with a test enable signal TESTEN and activated.

Further, a pseudo error generator circuit 14 is connected to the data path connected between the data output port Out1 of the memory array 11 and the data input port In2 of the ECC circuit 12. The pseudo error generator circuit 14 includes a pseudo random pulse generator circuit (which is hereinafter referred to as a PRPG circuit) 14A which receives a test enable signal TESTEN and clock CLK, a decoder 14B which decodes n-bit random pulse data output from the PRPG circuit 14A and generates $2^n$ decode outputs, an AND circuit 14C to which an output of the decoder 14B and the test enable signal TESTEN are input, and an EXOR circuit 14D which is supplied with an output of the AND circuit 14C at one input terminal. The EXOR circuit 14D further receives a data bit from the output port Out1 of the memory array 11 at the other input terminal.

Figure 2:
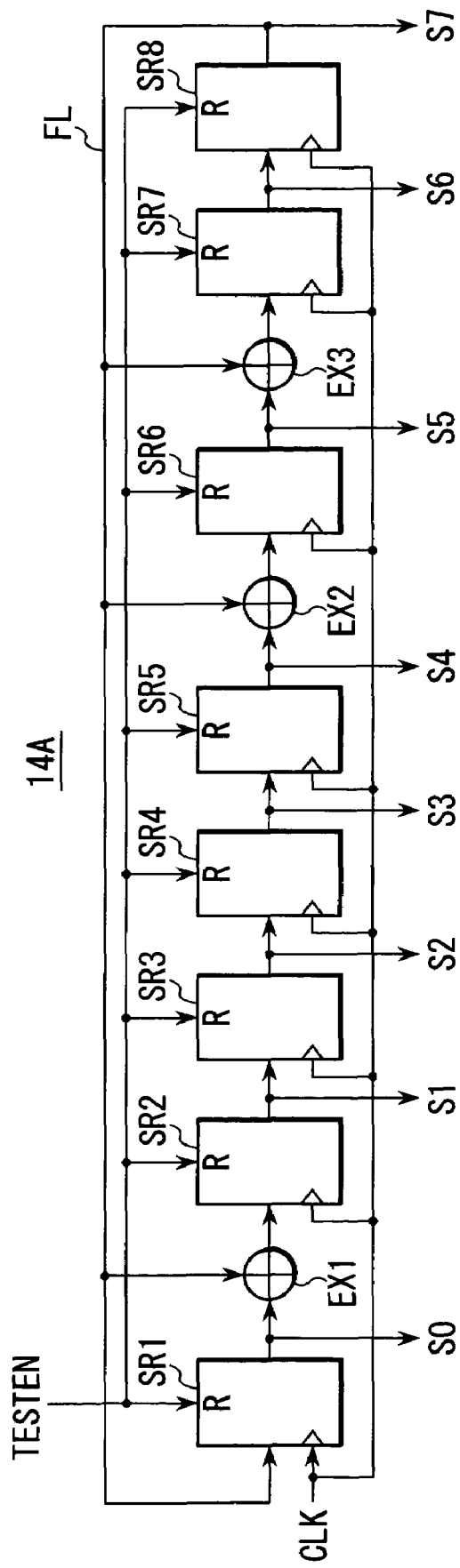
FIG. 2 is a block diagram showing a concrete circuit of a PRPG circuit of FIG. 1.

Next, one example of the concrete circuit of the PRPG circuit 14A is explained with reference to FIG. 2. In FIG. 2, the PRPG circuit 14A is a linear feedback shift register (LFSR) circuit of 8-bit configuration, for example. The PRPG circuit 14A includes eight series-connected shift registers SR1 to SR8 and EXOR circuits EX1, EX2, EX3 which are respectively connected between the shift registers SR1 and SR2, between the shift registers SR5 and SR6, and between the shift registers SR6 and SR7. Outputs S0 to S7 from the shift registers SR1 to SR8 are respectively supplied to the next-stage circuits and are also supplied as 8-bit output data (n=8) to the decoder 14B of FIG. 1. Further, the bit output S7 of the final-stage shift register SR8 is supplied to the EXOR circuits EX3, EX2, EX1 via a feedback circuit or feedback line FL and fed back to the input terminal of the first-stage shift register SR1.

In the circuit of FIG. 2, when the TESTEN signal of "L" level is supplied to the reset input terminals R of the shift registers SR1 to SR8, output signals of the shift registers SR1 to SR8 are initialized and set to a value other than S7 to S0=00000000.

In this state, when the TESTEN signal is set to an "H" level, output signals are output at a given timing corresponding to the clock CLK. At this time, the output S7 of the final-stage shift register SR8 is fed back to the first-stage shift register SR1 via the feedback line FL and is also fed back to the intermediate shift registers SR2, SR6, SR7 via the three EXOR circuits EX1, EX2, EX3. Therefore, outputs S0 to S7 of eight bits from the shift registers SR1 to SR8 represent a pseudo random number data.

The outputs S6 to S0 (n=7) of seven bits except the final-stage output S7, for example, among the pseudo random pulses of eight bits are supplied to the decoder 14B and a selected one of $2^7$ 1-bit decode outputs is supplied to one input terminal of the AND circuit 14C, while the test enable signal TESTEN is supplied to the other input terminal of the AND circuit 14C.

The AND circuit 14C supplies an "H" level signal to the EXOR circuit 14D only when the test enable signal TESTEN is "H" and the 1-bit decode output from the decoder 14B is "H". Therefore, an output from the EXOR circuit 14D is set to "H" or "L" when a data bit from the output port Out1 of the memory array 11 is "L" or "H", respectively. Thus, an inverted data bit or code bit is supplied as a pseudo soft error to the ECC circuit 12 from the EXOR circuit 14D.

The ECC circuit 12 detects the pseudo soft error and is activated to generate and supply correction data to the BIST circuit 13. As a result, the at-speed test for the memory array 11 and ECC circuit 12 is made by the BIST circuit 13, thereby making it possible to perform the screening for the critical path of the memory array 11.

In the embodiment of FIG. 1, a storage area which stores the code bits for the ECC circuit 12 is contained in the memory array 11. Therefore, all of the data bits and code bits are output from the output port Out1 and all of the bits are subjected to error correction by the ECC circuit 12.

However, when it is sufficient if the test for the data bits is made, it is satisfactory to perform the error correction process for the data bits. In this case, only the data bits may be supplied to the ECC circuit 12 via the pseudo error generator circuit 14.

SECOND EMBODIMENT

Figure 3:
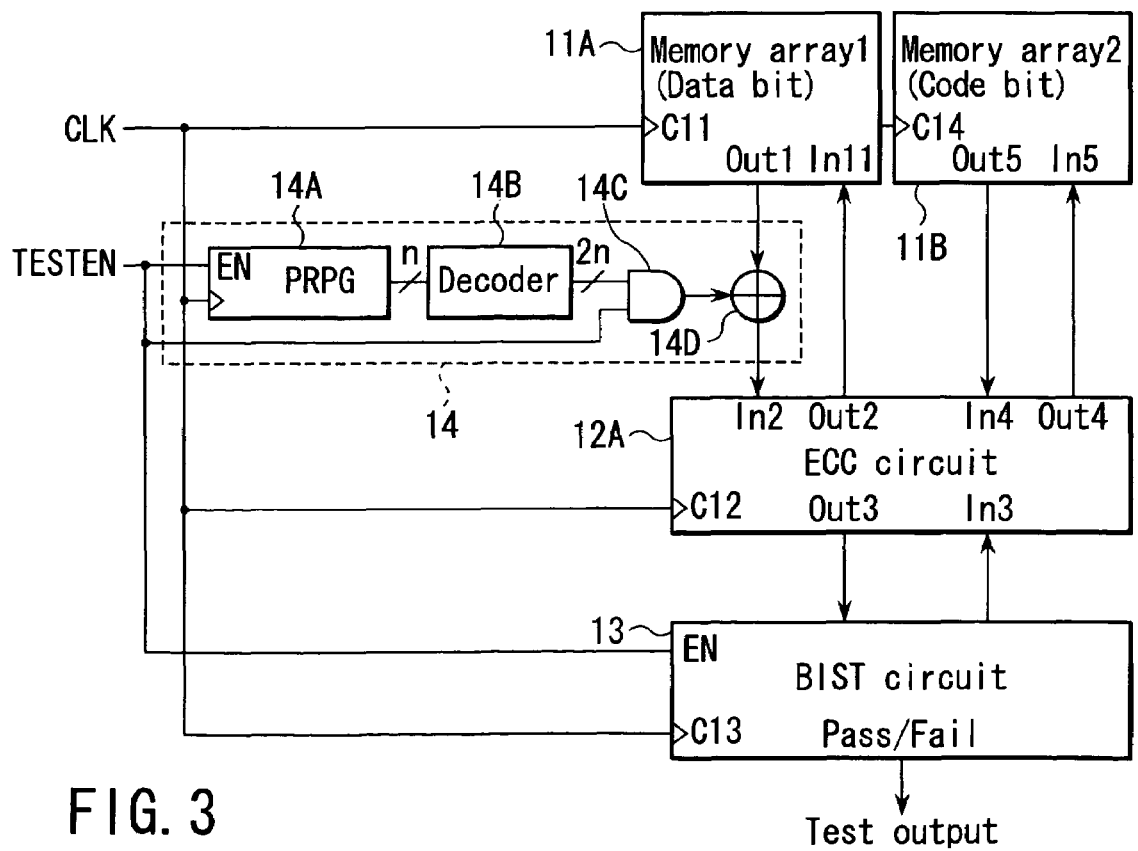
FIG. 3 is a block diagram showing the configuration of a second embodiment of this invention.

FIG. 3 is a block diagram showing the configuration of another embodiment of this invention which is configured based on the above idea. In FIG. 3, portions which correspond to those of FIG. 1 are denoted by the same or similar reference symbols and the detail explanation thereof is omitted.

In the embodiment of FIG. 3, a memory array 11A which stores data bits and a memory array 11B which stores code bits are separately provided. In the memory array 11A, an input port In1 and output port Out1 are provided together with a clock terminal C11. The ports In1 and Out1 are respectively connected to an output port Out2 and input port In2 of an ECC circuit 12A. Like the embodiment of FIG. 1, the ECC circuit 12A includes an input port In4 and output port Out4 together with a clock terminal C12 in addition to an input port In3 and output port Out3 connected to a BIST circuit 13. The input port In4 and output port Out4 are respectively connected to an output port Out5 and input port In5 of the memory array 11B. Further, a clock terminal C14 is provided in the memory array 11B and is supplied with the same clock CLK as that supplied to the memory array 11A.

In the embodiment of FIG. 3, only data bits stored in the memory array 11A including a data bit formed as a pseudo error bit in the pseudo error generator circuit 14 are supplied to the ECC circuit 12A. On the other hand, code bits stored in the memory array 11B are directly supplied to the ECC circuit 12A. Data bits which are subjected to an error correction process by the ECC circuit 12A and code bits which are not processed are combined as a word in the ECC circuit 12A and supplied to the BIST circuit 13 for test. Then, a test output having the contents of Pass/Fail is acquired.

In the embodiment of FIG. 3, the data bits and code bits are stored in the different memory arrays. However, the same operation can be attained by making a configuration as follows. That is, like the case of FIG. 1, the data bits and code bits are stored in the same memory array, only the data bits are supplied to the ECC circuit 12A via a first data path (not shown) including a bit path via the pseudo error generator circuit 14 at the time of readout from the memory array 11A and the code bits are directly supplied to the ECC circuit 12A via a second data path (not shown).

In the embodiment of FIG. 1, there is a possibility that a 1-bit error occurs in the data bits in the same word which is different from the pseudo error bit generated from the pseudo error generator circuit 14. In this case, a total of two bits of errors are included in the same word. If the ECC circuit 12 shown in FIG. 1 is of 1-bit correction type, it cannot correct errors of two bits and, therefore, the test output becomes a "fail" as the test result of the BIST circuit 13.

However, in a normal test circuit which does not use the pseudo error generator circuit 14, only the 1-bit error is supplied to an ECC circuit. Therefore, the 1-bit error can be corrected by the ECC circuit 12 and a "pass" output can be attained as the test output. In a case where the probability that a 1-bit error occurs in one word is extremely small, it is preferable to determine that the chip of a to-be-tested semiconductor device is a "pass" when taking it into consideration that the soft error test can be made.

THIRD EMBODIMENT

Figure 4:
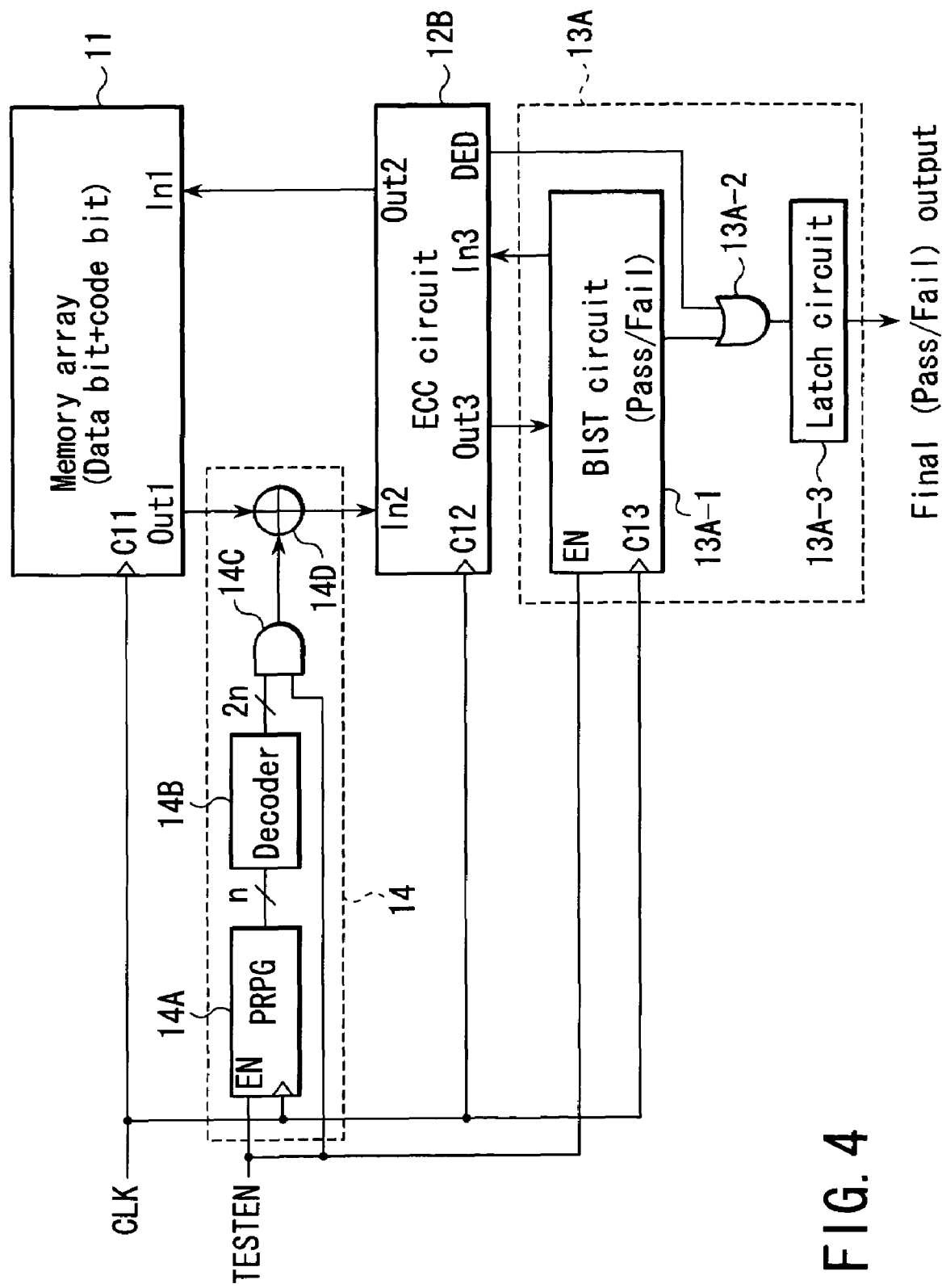
FIG. 4 is a block diagram showing the configuration of a third embodiment of this invention.

An embodiment of FIG. 4 is configured based on the above idea and a circuit using a code capable of correcting a 1-bit error and also capable of detecting a 2-bit error is used in an ECC circuit 12B.

In the embodiment of FIG. 4, portions which correspond to those of FIG. 1 are denoted by the same or similar reference symbols and the repetitive explanation thereof is omitted. In FIG. 4, the ECC circuit 12B has a terminal DED through which a signal indicating detection of a 2-bit error is output when the 2-bit error is detected. For example, an "H" level detection signal appears on the terminal DED when a 2-bit error is detected.

A BIST circuit 13A includes a BIST circuit section 13A-1 which receives an error correction output from the ECC circuit 12B, an OR circuit 13A-2 which receives a Pass/Fail output of "H" or "L" level of the BIST circuit section 13A-1 at one input terminal, and a latch circuit 13A-3 which latches an output of the OR circuit 13A-2. A detection signal of "H" or "L" level indicating the 2-bit error detection output from the terminal DED is supplied to the other input terminal of the OR circuit 13A-2.

In FIG. 4, if a bit error occurs in neither the data bit nor the code bit read out from the memory array 11, only one bit supplied from the pseudo error generator circuit 14 to the ECC circuit 12B becomes an error for one word. As a result, the ECC circuit 12B is activated and an error correction output is supplied to the BIST circuit 13A. In this case, a "pass" output ("H" level) is output from the BIST circuit section 13A-1 and an "L" level detection signal is obtained from the terminal DED of the ECC circuit 12B. Therefore, an output of the OR circuit 13A-2 is set to an "H" level and latched in the latch circuit 13A-3 and an "H" level test output is obtained as a final "pass" output.

Further, in FIG. 4, in a case where a bit error occurs in a data bit or code bit read out from the memory array 11, a total of two bits of errors containing an error of one bit supplied from the pseudo error generator circuit 14 to the ECC circuit 12B are provided for one word. Therefore, error correction becomes impossible and an error correction output from the activated ECC circuit 12B is not correctly corrected data. Therefore, when the error correction output from the ECC circuit 12B is supplied to the BIST circuit 13A, a "fail" output ("L" level) is obtained from the BIST circuit section 13A-1. Since a detection signal of "H" level indicating 2-bit error detection is obtained from the terminal DED of the ECC circuit 12B, the "H" level signal is supplied as an input to the OR circuit 13A-2 and an "H" level output is obtained from the OR circuit 13A-2. The "H" level output is latched in the latch circuit 13A-3 and a test output is obtained as a final "pass" output.

In the embodiment of FIG. 4, like the embodiment of FIG. 1, a storage area which stores code bits used for the ECC circuit 12B is contained in the memory array 11. Therefore, all of the data bits and code bits are output to the output port Out1 and all of the bits are subjected to error correction by the ECC circuit 12B.

However, when it is sufficient if the test for the data bits is made, it is satisfactory to perform the error correction process for the data bits. In this case, only the data bits including a data bit via the pseudo error generator circuit 14 may be supplied to the ECC circuit 12B.

FOURTH EMBODIMENT

Figure 5:
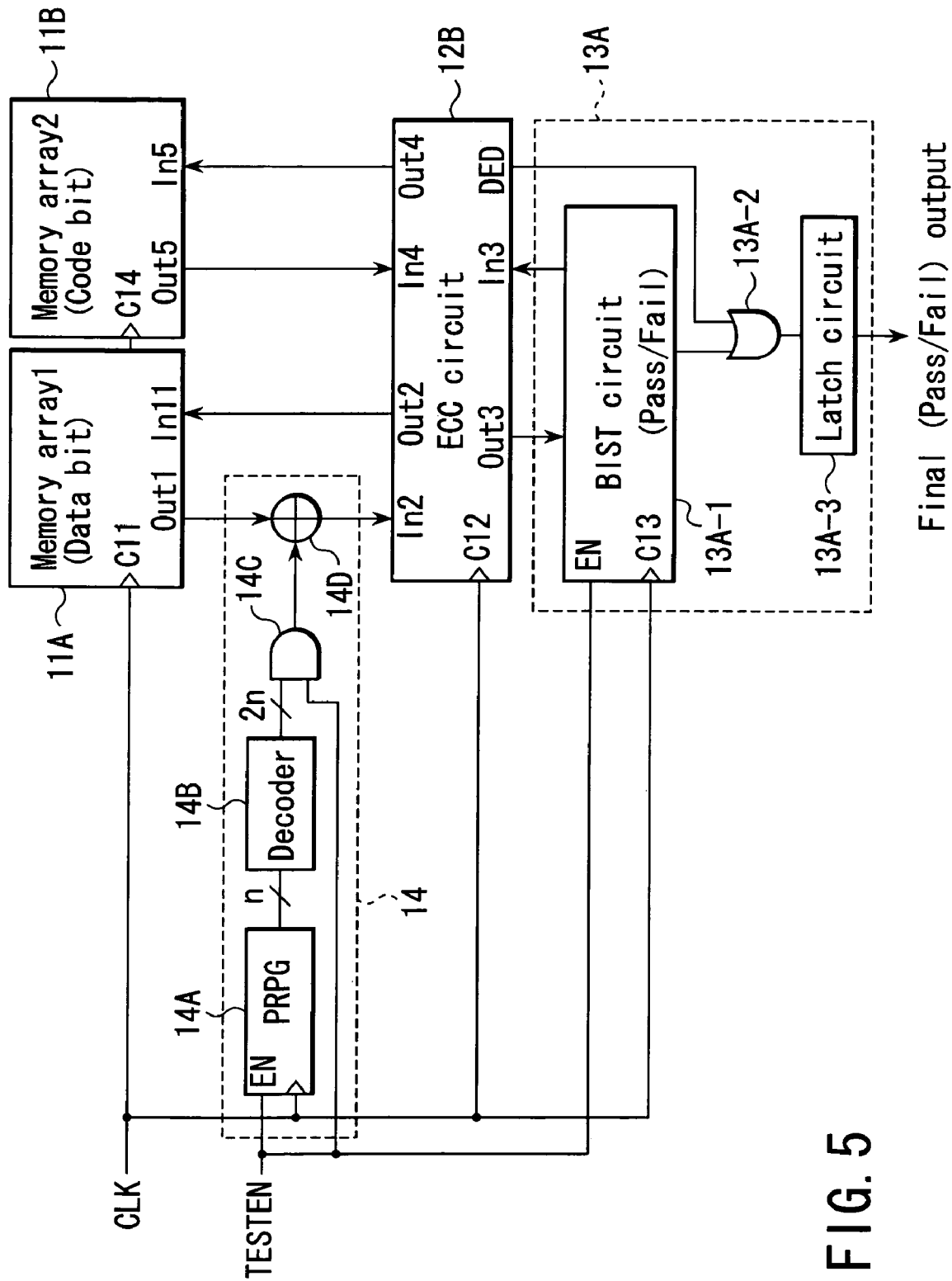
FIG. 5 is a block diagram showing the configuration of a fourth embodiment of this invention.

FIG. 5 is a block diagram showing the configuration of another embodiment of this invention configured based on the above idea. In FIG. 5, portions which correspond to those of FIG. 4 are denoted by the same or similar reference symbols and the detailed explanation thereof is omitted.

In the embodiment of FIG. 5, a memory array 11A which stores data bits and a memory array 11B which stores code bits are separately provided. In the memory array 11A, an input port In1 and output port Out1 are provided together with a clock terminal C11. The ports In1 and Out1 are respectively connected to an output port Out2 and input port In2 of an ECC circuit 12B. Like the embodiment of FIG. 4, the ECC circuit 12B includes an input port In4 and output port Out4 together with a clock terminal C12 in addition to an input port In3 and output port Out3 connected to a BIST circuit 13A. The input port In4 and output port Out4 are respectively connected to an output port Out5 and input port In5 of the memory array 11B. Further, a clock terminal C14 is provided in the memory array 11B and is supplied with the same clock CLK as that supplied to the memory array 11A. Further, a 2-bit error detection terminal DED is provided.

In the embodiment of FIG. 5, of the data bits stored in the memory array 11A only a data bit is supplied as a pseudo error bit to the ECC circuit 12B via a pseudo error generator circuit 14. On the other hand, code bits stored in the memory array 11B are directly supplied as it is to the input port In4 of the ECC circuit 12B. Data bits which are subjected to an error correction process by the ECC circuit 12B and code bits which are not processed are combined as a word in the ECC circuit 12B and supplied to the BIST circuit 13A for test. Then, a final test output having the contents of Pass/Fail can be acquired.

In the embodiment of FIG. 5, the data bits and code bits are stored in the different memory arrays 11A, 11B. However, like the case of FIG. 4, the same operation can be attained by making a configuration as follows. That is, the data bits and code bits are stored in the same memory array, only the data bits are supplied to the ECC circuit 12B via a first data path (not shown) including the pseudo error generator circuit 14 at the time of readout from the memory array and the code bits are directly supplied to the ECC circuit 12B via a second data path (not shown).

Figure 6:
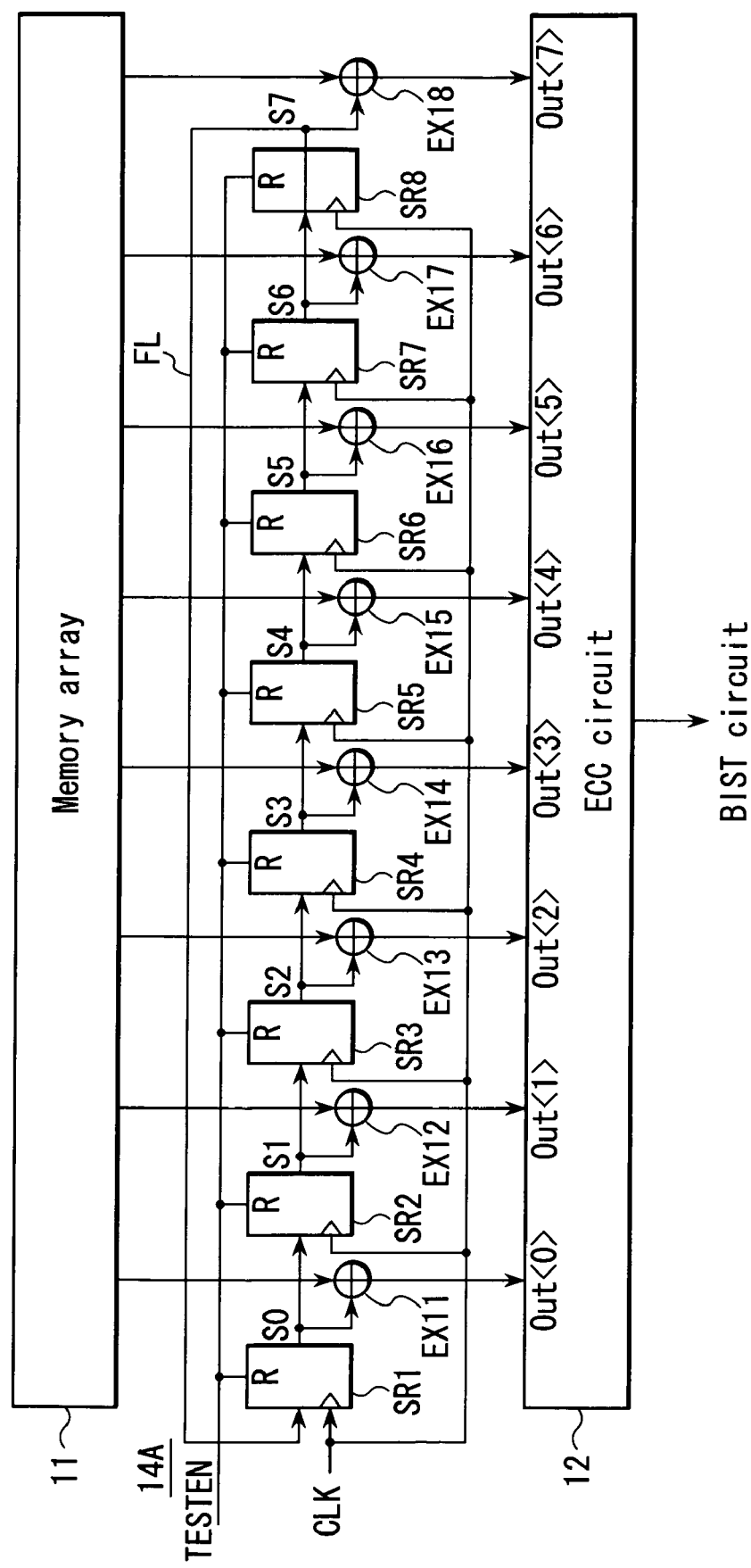
FIG. 6 is a block diagram showing the configuration of a fifth embodiment of this invention.

In the embodiments of FIGS. 1, 3 to 5, a case wherein the pseudo error generator circuit 14 is configured by use of the pseudo random pulse generator circuit (PRPG circuit) 14A with the configuration shown in FIG. 2 is explained. However, a circuit of another configuration can be used as the pseudo error generator circuit. FIG. 6 shows still another embodiment using one example of the pseudo error generator circuit 14A.

FIFTH EMBODIMENT

In FIG. 6, the pseudo error generator circuit 14A includes eight series-connected shift registers SR1 to SR8 and eight EXOR circuits EX11 to EX18. The EXOR circuits EX11 to EX18 are connected to respectively receive output bits of the shift registers SR1 to SR8 at one input terminal and respectively receive eight output bits of the memory array 11 at the other input terminal. Further, outputs Out<0> to Out<7> from the output terminals of the EXOR circuits are supplied to the ECC circuit 12.

Outputs S0 to S7 from the shift registers SR1 to SR7 are respectively supplied to the next-stage circuits and are supplied to the final-stage shift register SR8 of the EXOR circuit. In this case, the output S7 of the final-stage shift register SR8 is supplied to the EXOR circuit EX18 and fed back to the input terminal of the first-stage shift register SR1. via a feedback circuit FL. Further, a test enable signal TESTEN is supplied to the reset terminals of the shift registers SR1 to SR8 and a clock CLK is supplied to the clock terminals thereof.

In the circuit of FIG. 6, if the TESTEN signal of "L" level is supplied to the reset input terminals R of the shift registers SR1 to SR8, output signals S0 to S7 of the shift registers SR1 to SR8 are initialized and only one of the output signals S0 to S7 is initialized to be set to the "H" level "1". For example, only the output S0 of the first-stage shift register SR1 is set to the "H" level.

After this, if the clock CLK is supplied while the test enable signal TESTEN is kept in the "H" state, for example, the output signal S1 of the shift register SR2 is set to the "H" level at the timing of a rise of the "H" level of the clock CLK. Then, the output signal S1 is supplied to the EXOR circuit EX12. At this time, if a data bit which is read out from the memory array 11 and supplied to the EXOR circuit EX12 is set at the "L" level, the output Out<1> of the EXOR circuit EX12 is inverted to "H" and supplied to the ECC circuit 12 as a pseudo error bit. On the contrary, if the data bit is "H", it is inverted to "L" and also supplied to the ECC circuit 12 as a pseudo error bit.

The outputs of the shift registers SR3, SR4, . . . are sequentially set to "H" each time the clock CLK is supplied while the signal TESTEN is kept in the "H state. Then, a pseudo soft error of 1-bit/word is sequentially supplied from a corresponding one of the EXOR circuits EX12, EX13, . . . in response to the output of the memory array 11.

The ECC circuit 12 detects a pseudo soft error and is activated to generate and supply correction data to the BIST circuit. As a result, the at-speed test for the memory array 11 and ECC circuit 12 is made by the BIST circuit of the following stage, thereby making it possible to perform the screening process for the critical path of the memory array 11. In the explanation for FIG. 6, data bits are read out from the memory array 11 and a pseudo soft error is supplied. However, if code bits for error correction are stored in the memory array 11, the code bits may also be read out in succession to the data bits, for example, and then a pseudo soft error may be supplied in the same manner as described above, for example.

SIXTH EMBODIMENT

In each of the first to fifth embodiments described above, a pseudo soft error is generated for a given data bit. However, the same effect can be attained even if a bit which causes a pseudo error to be generated is fixed.

Figure 7:
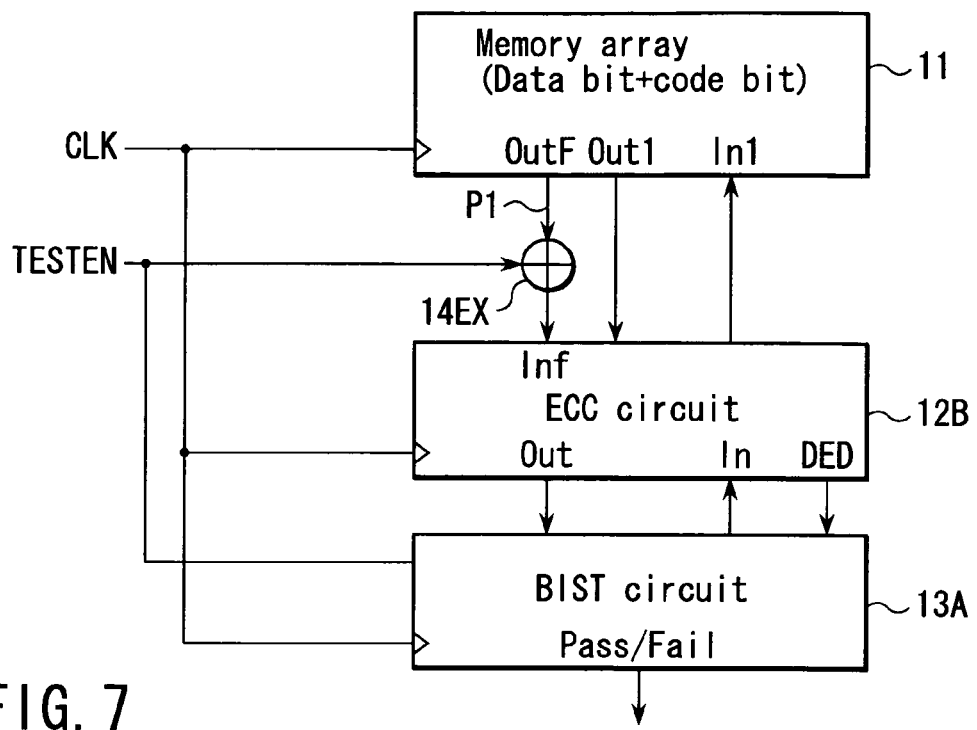
FIG. 7 is a block diagram showing the configuration of a sixth embodiment of this invention.

FIG. 7 shows a block configuration of an embodiment configured based on the above idea. A bit path P1 connected to a specified output port OutF of a memory array 11 in which data bits and code bits are stored is connected to one input terminal of an EXOR circuit 14EX. A test enable signal TESTEN is supplied to the other input terminal of the EXOR circuit 14EX whose output is connected to a specified input port Inf of an ECC circuit 12B. The ECC circuit 12B is configured in the same manner as in the embodiment of FIG. 4.

In the circuit of FIG. 7, if a bit signal read out from the memory array 11 to the output port OutF is set at the "H" level, for example, it is inverted to the "L" level when the test enable signal TESTEN is set at the "H" level. Then, it is supplied as a pseudo soft error bit to the input port Inf of the ECC circuit 12B. As a result, the ECC circuit 12B is activated via the path P1 connected to the input port Inf and an error correction operation is performed. The remaining data bits and code bits are supplied to the ECC circuit 12B via the output port Out1. The entire operation of the embodiment of FIG. 7 is the same as that of the embodiment of FIG. 4 and no further detail explanation thereof is made. However, the pseudo error generator circuit includes only the EXOR circuit 14EX and the circuit configuration is made extremely simple in comparison with that of the embodiment of FIG. 4.

SEVENTH EMBODIMENT

In each of the first to sixth embodiments, a pseudo soft error is generated by use of the EXOR circuit provided on the bit path from the memory array to the ECC circuit. Thus, the EXOR circuit provided on the bit path may cause the operation speed of the test circuit to be lowered in some cases.

Figure 8:
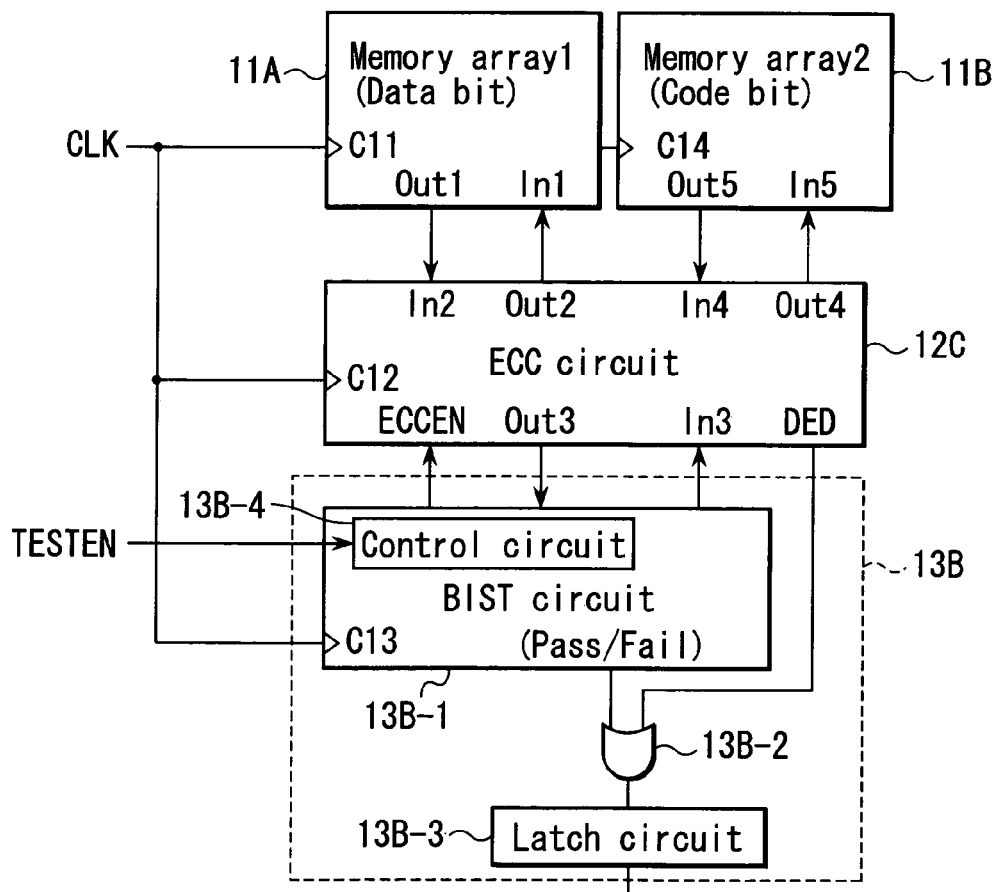
FIG. 8 is a block diagram showing the configuration of a seventh embodiment of this invention.

FIG. 8 shows an embodiment configured to cope with the above case. In FIG. 8, the whole configuration can be considered to be obtained by omitting the pseudo error generator circuit 14 in the embodiment of FIG. 5. Portions of FIG. 8 which correspond to those of FIG. 5 are denoted by the same or similar reference symbols and the explanation thereof is omitted. As is clearly understood from FIG. 8, this embodiment is configured to supply a data bit output from the output port Out1 of the memory array 11A directly to the input port In2 of the ECC circuit 12C without using the EXOR circuit connected to the pseudo error generator circuit.

The ECC circuit 12C has a 2-bit error detection terminal DED and enable signal input terminal ECCEN. The ECCEN terminal receives a control output from a control circuit 13B-4 provided in a BIST circuit 13B-1. A control output of the control circuit 13B-4 is supplied to the ECCEN terminal of the ECC circuit 12C. The ECC circuit 12C is selectively set into one of two operation modes according to a level of the control output of the control circuit 13B-4 of the BIST circuit 13B-1.

First, when an ECCEN signal is at the "H" level, the ECC circuit 12C is set in the normal mode. Therefore, when data bits are written into a memory array 11A at the data write time, corresponding error correction code bits are written into a memory array 11B.

When the ECCEN signal is at the "L" level, the ECC circuit 12C is set in a non-operative mode and is thus set in a state in which it does not function as an ECC circuit. Therefore, when data bits are written into the memory array 11A at the data write time, corresponding error correction code bits are not written into the memory array 11B.

Like the embodiment of FIG. 5, the DED terminal of the ECC circuit 12C is connected to one input terminal of an OR circuit 13B-2 of a BIST circuit 13B and a Pass/Fail output of the BIST circuit section 13B-1 is supplied to the other input terminal thereof. An output of the OR circuit 13B-2 is output as a final (Pass/Fail) output from a latch circuit 13B-3.

Figure 9:
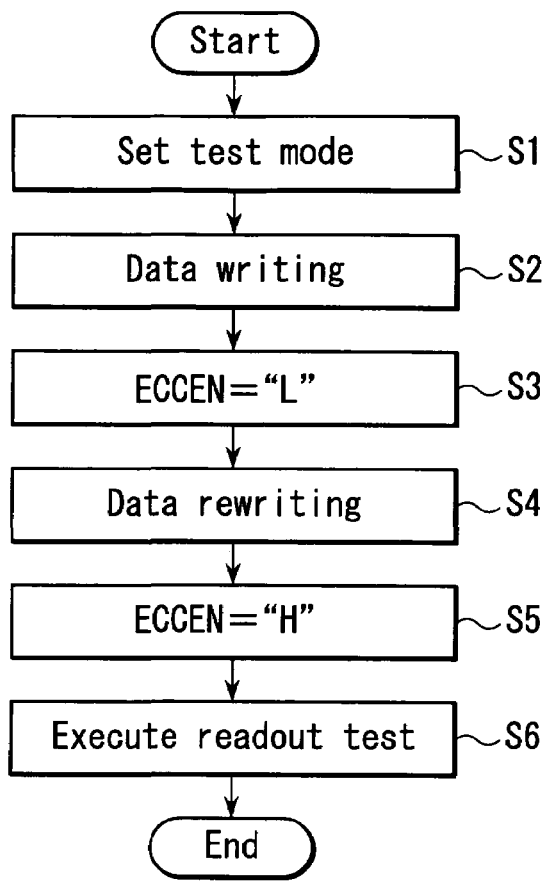
FIG. 9 is a flowchart for illustrating the operation of the seventh embodiment.
Figure 10:
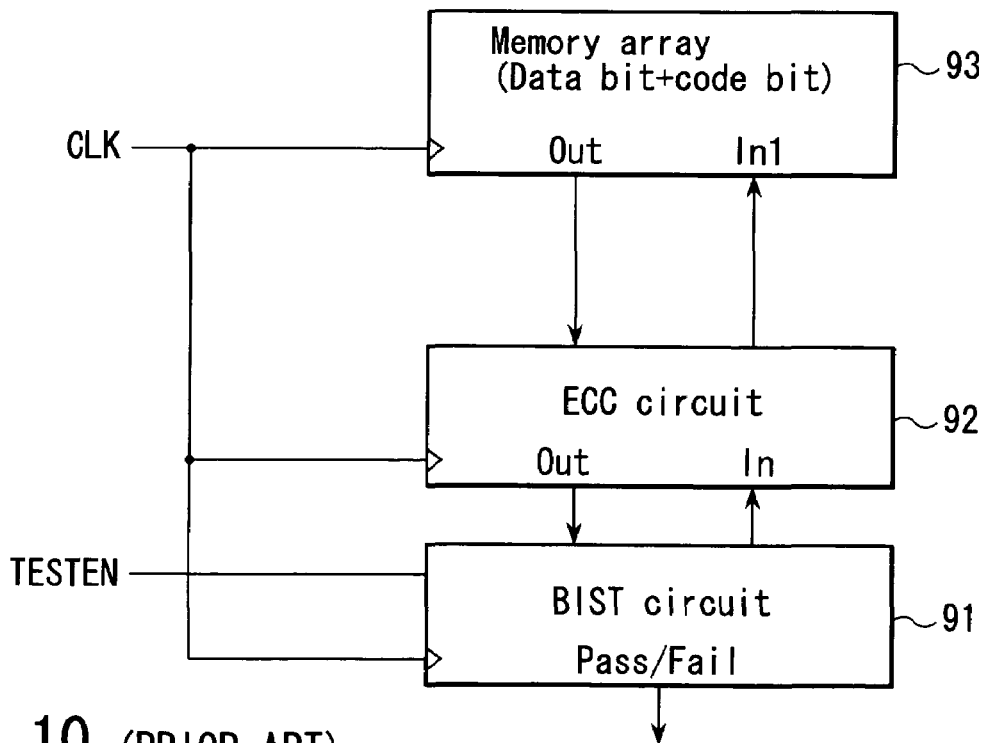
FIG. 10 is a block diagram showing the configuration of a conventional test circuit.

Next, the operation of the embodiment of FIG. 8 containing the control circuit 13B-4 is explained with reference to the flowchart of FIG. 9. In the embodiment of FIG. 8, when a test mode is set in the step S1 of FIG. 9, a test enable signal TESTEN is first set to the "H" level. Then, the control circuit 13B-4 which has received the TESTEN signal supplies an "H" level signal to the terminal ECCEN of the ECC circuit 12C. As a result, the ECC circuit 12C is set into the normal operation mode and data bits are written into the memory array 11A in a normal state in the step S2.

After this, the ECCEN signal is set to the "L" level in the step S3. Then, data bits including one inverted bit obtained by inverting one bit of data bits written into the same address of the memory array 11A in the step S2 is written into the memory array 11A in the step S4. At this time, code bits corresponding to the data are not written into the memory array 11B. Therefore, data containing a one-bit/word error is written as combined data of the data of the memory array 11A and the code of the memory array 11B.

In this state, a signal to the terminal ECCEN is set to the "H" level again in the step S5 and the ECC circuit 12C is set into the normal operation mode. Further, if a test to read out data stored in the memory arrays 11A and 11B is made in the step S6 in this state, the ECC circuit 12C detects the error and is activated to output an error correction output to the BIST circuit section 13B. In the case of a 1-bit error, the BIST circuit 13B-1 outputs a "pass" signal of "H" level to the OR circuit 13B-2. At this time, the DED signal is set at the "L" level, but an output of the OR circuit 13B-2 is set to the "H" level. Therefore, a final "pass" output is output via the latch circuit 13B-3.

When a 2-bit error is detected by the ECC circuit 12C, the DED signal is set to the "H" level. Further, an output of the BIST circuit 13B-1 becomes a "fail" of "L" level, but like the embodiment of FIG. 5, a final "pass" output can be acquired from the latch circuit 13B-3.

According to the embodiments of this invention, the semiconductor device having the memory, ECC circuit and BIST circuit is so configured that an error correction can be made without fail by the ECC circuit at the test time in a state in which the ECC circuit and BIST circuit are activated. Thus, the semiconductor device capable of performing the satisfactory screening process for critical paths of the ECC circuit and memory, for example, can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a memory which stores data configured with data bits;
an ECC circuit which corrects a bit error of the data read out from the memory and generates correction data bits;
a memory test circuit which receives all data bits read out from the memory including the correction data bits and tests whether a read operation of all the data bits with respect to the memory is performed correctly;
a mode setting circuit for setting the ECC circuit and the memory test circuit to a test mode;
a pseudo error generator circuit which generates a pseudo error for at least one bit configuring the data bits read out from the memory in a test mode; and
a supplying circuit for supplying the data bits including the pseudo error bit generated in the pseudo error generator circuit to the ECC circuit for obtaining error-corrected data bits including a corrected bit corresponding to the pseudo error bit,
whereby testing whether the read operation of all the data bits with respect to the memory is performed correctly by supplying the error-corrected data bits including the corrected bit corresponding to the pseudo error bit to the memory test circuit, and testing whether data correction in the ECC circuit is performed correctly by supplying the data bits including the pseudo error bit to the ECC circuit in the test mode.

2. The semiconductor device according to claim 1, wherein the pseudo error generator circuit includes an inverting circuit for inverting the one bit read out from the memory in the test mode.

3. The semiconductor device according to claim 2, wherein the inverting circuit is connected between a data bit output terminal of the memory and a data bit input terminal of the ECC circuit.

4. The semiconductor device according to claim 2, wherein the inverting circuit includes an EXOR circuit.

5. The semiconductor device according to claim 1, wherein the pseudo error generator circuit includes a random pulse generator circuit, a decoder which decodes random pulse data generated from the random pulse generator circuit, a logic circuit which receives a decoder output from the decoder and a test signal, and an inverter for inverting bit data read out from the memory in response to an output of the logic circuit in the test mode.

6. The semiconductor device according to claim 5, wherein the random pulse generator circuit includes a linear feedback shift register circuit having a plurality of shift registers serially connected, a feedback circuit which feeds back a final-stage output to a preset position of the shift register circuit, and at least one EXOR circuit to which the fed-back final-stage output and an output of the preceding-stage shift register are input.

7. The semiconductor device according to claim 5, wherein the inverter includes an EXOR circuit.

8. The semiconductor device according to claim 5, wherein the random pulse generator circuit includes a linear feedback shift register circuit having series-connected registers of a number which is larger than the number of bits output to the decoder by at least one bit.

9. The semiconductor device according to claim 2, wherein the inverting circuit includes a plurality of data paths configured to contain shift registers and inverts only one data bit which passes through one of the data paths selected by outputs of the shift registers.

10. The semiconductor device according to claim 1, wherein the ECC circuit has a 1-bit error correction function and a 2-bit error detection function and the memory test circuit has a configuration to output a "pass" output at a time of 2-bit error detection detected by the ECC circuit.

11. The semiconductor device according to claim 10, wherein the ECC circuit is configured to output a 2-bit error detection signal, and the memory test circuit includes a memory test circuit section configured to deliver a Fail output when the Fail output is supplied thereto from the ECC circuit and a logic circuit configured to convert the Fail output to a Pass output when the 2-bit error detection signal is supplied from the ECC circuit to the memory test circuit section.

12. The semiconductor device according to claim 2, wherein the EXOR circuit is fixedly connected between a specified bit output terminal of the memory and a specified bit input terminal of the ECC circuit.

13. The semiconductor device according to claim 1, wherein the memory is configured to store the data bits and the ECC code bits at respective address positions.

14. The semiconductor device according to claim 1, wherein the memory includes a first memory array storing data bits and a second memory array storing ECC code bits.

15. The semiconductor device according to claim 14, wherein the pseudo error generation circuit is provided between the first memory array and the ECC circuit.

16. A semiconductor device comprising:
a memory which stores data bits and ECC code bits;
an ECC circuit which is connected to the memory for supplying the data bits and ECC code bits to write into the memory in a normal operation mode and corrects a bit error of one bit in the data and a code bit in the ECC code bits read out from the memory and generates correction data;
a memory test circuit which receives all the data bits and the ECC code bits including a correction data output of the ECC circuit for testing whether a data reading operation of all the data bits and the ECC code bits at the memory is correctly performed;
a first set circuit configured to set the ECC circuit and the memory test circuit into a test mode;
a second set circuit configured to set the ECC circuit into a non-operative state in the test mode;
a write circuit configured to write the data bits and the ECC code bits into the memory via the ECC circuit set in the non-operative state; and
a read circuit configured to read out the data bits written in the memory in the non-operative state at the test mode and the ECC code bits written at the normal operation mode for supplying to the ECC circuit;
wherein, in the test mode, the data bits written into the memory via the ECC circuit set in the non-operative state and the ECC code bits written at the normal operation mode are supplied to the ECC circuit set at the normal operation mode for correcting a bit error, all the data bits and the ECC code bits including the error-corrected data bits obtained from the ECC circuit are supplied from the memory to the memory test circuit for testing whether the read operation of the data bits with respect to the memory is performed correctly, and the data bits written in the memory via the ECC circuit set at the non-operative state are read from the memory for supplying to the ECC circuit set at the operative state to verify whether data correction in the ECC circuit is performed correctly.

17. The semiconductor device according to claim 16, wherein the memory test circuit includes, as the second set circuit for setting the ECC circuit and the memory test circuit at the non-operative state, a control circuit configured to supply an operation control signal to the ECC circuit in the test mode.

18. A test method for a semiconductor device comprising:
storing data bits and ECC code bits into a memory when an ECC circuit is set in an operative state;
writing the data bits and ECC code bits into the memory in a normal operative mode via an ECC circuit for correcting a data bit error in the data bits and a code bit error in the ECC code bits read out from the memory to generate correction data;
testing in a memory test circuit all the data bits including the correction data from the ECC circuit whether a data reading operation of all the data bits at the memory is correctly performed;
setting the ECC circuit and the memory test circuit into a test mode and setting the ECC circuit into a non-operative state in the test mode;
overwriting the data bits and ECC code bits into the memory while the ECC circuit is set in the non-operative state in the test mode; and
reading out the data bits written in the memory in the non-operative state at the test mode and the ECC code bits from the memory written in the normal operation mode and for supplying the bits to the ECC circuit; and
supplying correction data output from the ECC circuit to the memory test circuit;
wherein, in the test mode, the data bits written into the memory via the ECC circuit set in the non-operative state and the ECC code bits written at the normal operation mode are supplied to the ECC circuit set at the normal operation mode for correcting a bit error, the error-corrected data bits are supplied to the memory test circuit for testing whether the read operation of the data bits with respect to the memory is performed correctly, and the data bits written in the memory via the ECC circuit set at the non-operative state are read from the memory for supplying to the ECC circuit set at the operative state to verify whether data correction in the ECC circuit is performed correctly.

* * * * *